United States Patent
Han

(10) Patent No.: US 7,123,524 B1
(45) Date of Patent: Oct. 17, 2006

(54) INPUT CIRCUIT HAVING UPDATED OUTPUT SIGNAL SYNCHRONIZED TO CLOCK SIGNAL

(75) Inventor: Jonghee Han, Cary, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/128,688

(22) Filed: May 13, 2005

(51) Int. Cl.
*G11C 7/00* (2006.01)

(52) U.S. Cl. .................. 365/193; 365/233; 365/194; 327/3

(58) Field of Classification Search .............. 365/193, 365/233, 194; 327/3
See application file for complete search history.

(56) References Cited

U.S. PATENT DOCUMENTS

| | | | |
|---|---|---|---|
| 4,924,441 A * | 5/1990 | Inskeep | .................. 365/193 |
| 5,694,062 A * | 12/1997 | Welch et al. | .................. 327/3 |
| 6,052,329 A | 4/2000 | Nishino et al. | |
| 6,240,042 B1 | 5/2001 | Li | |
| 6,381,194 B1 | 4/2002 | Li | |
| 6,445,642 B1 | 9/2002 | Murakami | |
| 6,529,993 B1 | 3/2003 | Rogers et al. | |
| 6,707,723 B1 * | 3/2004 | Jeong | .................. 365/233 |
| 6,922,367 B1 * | 7/2005 | Morzano et al. | .......... 365/193 |

* cited by examiner

*Primary Examiner*—Huan Hoang
(74) *Attorney, Agent, or Firm*—Dicke, Billing & Czaja, P.L.L.C.

(57) ABSTRACT

An input circuit including a first circuit, a second circuit, and a third circuit. The first circuit is configured to receive a first signal and a second signal and to sample the first signal via the second signal and provide signal samples of the first signal. The second circuit is configured to receive a third signal and the signal samples and to update a second circuit output signal via the third signal and provide the updated second circuit output signal. The third circuit is configured to receive a clock signal and the second signal and to provide the third signal. The third circuit is also configured to synchronize edges in the third signal to edges in the second signal and edges in the clock signal.

31 Claims, 7 Drawing Sheets

INPUT CIRCUIT HAVING UPDATED OUTPUT SIGNAL SYNCHRONIZED TO CLOCK SIGNAL

CROSS-REFERENCE TO RELATED APPLICATIONS

This application is related to U.S. patent application Ser. No. 10/674,177 entitled "RANDOM ACCESS MEMORY WITH POST-AMBLE DATA STROBE SIGNAL NOISE REJECTION", filed on Sep. 29, 2003, which is incorporated herein by reference.

BACKGROUND

Typically, a computer system includes a number of integrated circuit chips that communicate with one another to perform system applications. Chip speeds continue to increase and the amount of data communicated between chips continues to increase to meet the demands of system applications. As the volume of digital data communicated between chips increases, higher bandwidth communication links are needed to prevent data communication bottlenecks between chips.

Often, a computer system includes a controller, such as a micro-processor, and one or more memory chips, such as random access memory (RAM) chips. The RAM chips can be any suitable type of RAM, such as dynamic RAM (DRAM), double data rate synchronous DRAM (DDR-SDRAM), graphics DDR-SDRAM (GDDR-SDRAM), and pseudo static RAM (PSRAM). The controller and RAM communicate data with one another to perform system applications.

Typically, data is received at an integrated circuit, such as a RAM, and sampled via a strobe signal that is also received at the integrated circuit. Multiple data signals can be sampled in parallel via one strobe signal to provide multiple strobe signal rising edge data bits and multiple strobe signal falling edge data bits. The sampled data bits are clocked into the integrated circuit via a clock signal.

As chip speeds increase, the amount of data communicated between chips increases to meet the demands of system applications. Higher bandwidth communication links can be built by communicating more data signals in parallel and/or increasing input/output (I/O) data bit and strobe signal speeds. However, using one strobe signal to sample an increased number of data signals in parallel can increase the skew of the strobe signal and the sampled data bits, which can contribute to setup and hold window shifts during sampling of the data signals and clocking the sampled data bits into the integrated circuit. Also, increasing data bit and strobe signal speeds exacerbates the strobe signal and sampled data bit skew problem related to clocking the sampled data bits into the integrated circuit via the clock signal.

For these and other reasons there is a need for the present invention.

SUMMARY

One aspect of the present invention provides an input circuit including a first circuit, a second circuit, and a third circuit. The first circuit is configured to receive a first signal and a second signal and to sample the first signal via the second signal and provide signal samples of the first signal. The second circuit is configured to receive a third signal and the signal samples and to update a second circuit output signal via the third signal and provide the updated second circuit output signal. The third circuit is configured to receive a clock signal and the second signal and to provide the third signal. The third circuit is also configured to synchronize edges in the third signal to edges in the second signal and edges in the clock signal.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
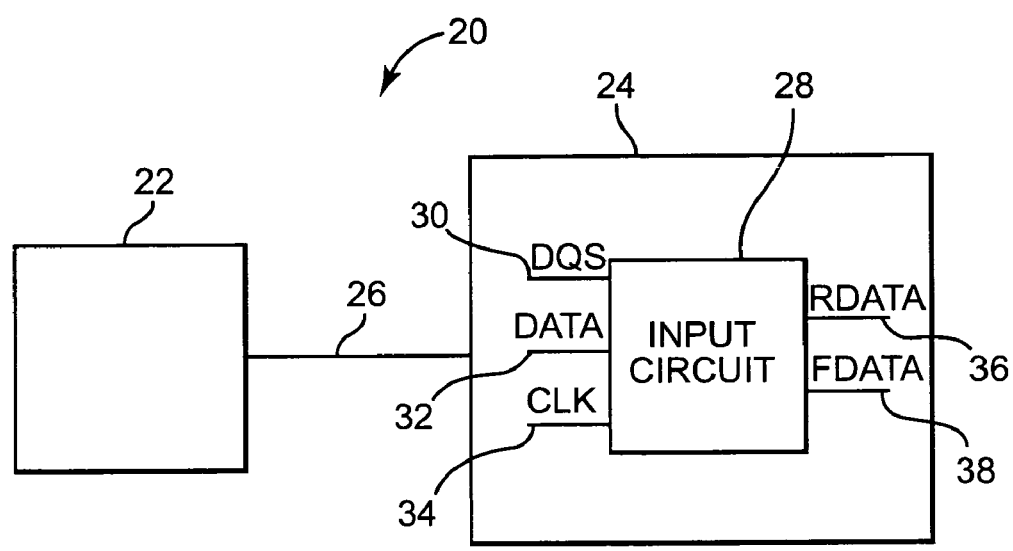
FIG. 1 is a block diagram illustrating one embodiment of a computer system according to the present invention.

FIG. 1 is a block diagram illustrating one embodiment of a computer system 20 according to the present invention. The computer system 20 includes a first integrated circuit chip 22 and a second integrated circuit chip 24. Chip 22 is electrically coupled to chip 24 via communications path 26. In one embodiment, chip 22 is a memory controller and chip 24 is a RAM, such as a DRAM, a DDR-SDRAM, a GDDR-SDRAM, or a PSRAM. The controller and RAM communicate with one another to perform system applications. In other embodiments, chip 22 and chip 24 can be any suitable chips that communicate with one another.

Chip 22 includes a suitable number of transmitter and receiver pairs and chip 24 includes a suitable number of transmitter and receiver pairs. Each transmitter and receiver pair in chip 22 corresponds to a transmitter and receiver pair in chip 24. Communications path 26 includes one or more signal pathways and each transmitter and receiver pair in chip 22 is electrically coupled to the corresponding transmitter and receiver pair in chip 24 via at least one of the signal pathways in communications path 26.

Chip 24 includes an input circuit 28 that receives a strobe signal DQS at 30, a data signal DATA at 32, and a clock signal CLK at 34. Input circuit 28 samples data signal DATA at 32 via strobe signal DQS at 30 to provide sampled data bits. Input circuit 28 updates output signals to sampled data bit values via an updating strobe signal. The updated output signals are clocked into chip 24 via clock signal CLK at 34 to provide rising edge data bit signal RDATA at 36 and falling edge data bit signal FDATA at 38.

Input circuit 28 synchronizes the updating strobe signal and updating of the output signals to strobe signal DQS at 30 and clock signal CLK at 34. The output signals are updated after previously updated output signals have been clocked into chip 24 via clock signal CLK at 34. Synchronizing the updating strobe signal to strobe signal DQS at 30 and clock signal CLK at 34 ensures that skew of strobe signal DQS at 30 and of the sampled data bits does not affect clocking sampled data bit values into chip 24 via clock signal CLK at 34. Reliable communications between chip 22 and chip 24 can be maintained with an increased number of data signals being sampled in parallel via one strobe signal, and with an increase in the input data bit and strobe signal speeds. In one embodiment, chip 24 includes any suitable number of input circuits, such as input circuit 28, and chip 24 receives any suitable number of data signals, such as data signal DATA at 32, and strobe signals, such as strobe signal DQS at 30, from chip 22 via communications path 26.

Figure 2:
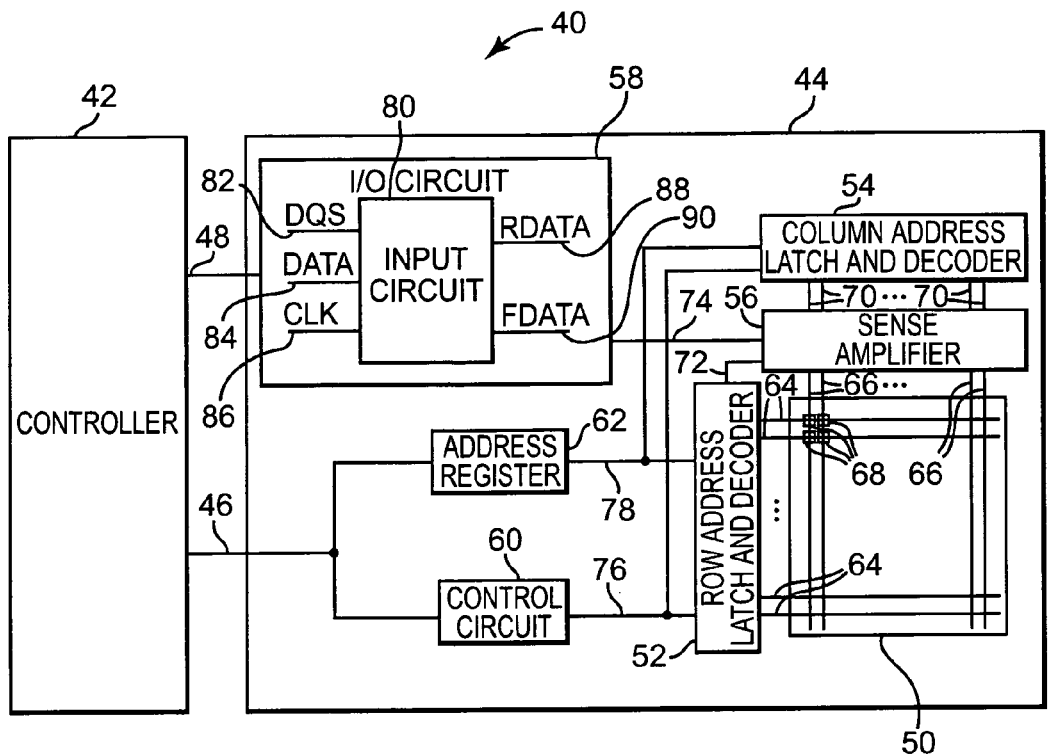
FIG. 2 is a block diagram illustrating one embodiment of a computer system including a controller and a RAM according to the present invention.

FIG. 2 is a block diagram illustrating one embodiment of a computer system 40 according to the present invention. Computer system 40 includes a controller 42 and a RAM 44. Controller 42 is electrically coupled to RAM 44 via memory communications path 46 and data communications path 48. Controller 42 provides row and column addresses and control signals to RAM 44 via memory communications path 46. Controller 42 provides data signals and strobe signals to RAM 44 and receives data signals and strobe signals from RAM 44 via data communications path 48. RAM 44 can be any suitable type of RAM, such as a DRAM, a DDR-SDRAM, a GDDR-SDRAM, or a PSRAM. In one embodiment, RAM 44 is a DRAM, such as a fourth generation DDR SDRAM (DDR4 SDRAM), a third generation GDDR SDRAM (GDDR3 SDRAM), a fourth generation GDDR SDRAM (GDDR4 SDRAM), or a later generation of DRAM.

RAM 44 includes an array of memory cells 50, a row address latch and decoder 52, a column address latch and decoder 54, a sense amplifier circuit 56, a RAM I/O circuit 58, a control circuit 60, and an address register 62. Conductive word lines 64, referred to as row select lines, extend in the x-direction across the array of memory cells 50. Conductive bit lines 66, referred to as digit lines, extend in the y-direction across the array of memory cells 50. A memory cell 68 is located at each cross point of a word line 64 and a bit line 66.

Each word line 64 is electrically coupled to row address latch and decoder 52 and each bit line 66 is electrically coupled to one of the sense amplifiers in sense amplifier circuit 56. The sense amplifier circuit 56 is electrically coupled to column address latch and decoder 54 via conductive column select lines 70. Also, sense amplifier circuit 56 is electrically coupled to row address latch and decoder 52 via communications path 72 and to RAM I/O circuit 58 via I/O communications path 74. RAM I/O circuit 58 is electrically coupled to controller 42 via data communications path 48. Data signals and strobe signals are transferred between RAM I/O circuit 58 and controller 42 via data communications path 48.

Controller 42 is electrically coupled to RAM I/O circuit 58 via data communications path 48 and to control circuit 60 and address register 62 via memory communications path 46. Control circuit 60 is electrically coupled to row address latch and decoder 52 and column address latch and decoder 54 via control communications path 76. Address register 62 is electrically coupled to row address latch and decoder 52 and column address latch and decoder 54 via row and column address lines 78.

Address register 62 receives row and column addresses from controller 42 via memory communications path 46. Address register 62 supplies a row address to row address latch and decoder 52 via row and column address lines 78, and control circuit 60 supplies a RAS signal to row address latch and decoder 52 via control communications path 76 to latch the supplied row address into row address latch and decoder 52. Address register 62 supplies a column address to column address latch and decoder 54 via row and column address lines 78, and control circuit 60 supplies a CAS signal to column address latch and decoder 54 via control communications path 76 to latch the supplied column address into column address latch and decoder 54.

Row address latch and decoder 52 receives row addresses and RAS signals and latches the row addresses into row address latch and decoder 52. Row address latch and decoder 52 decodes each of the row addresses to select a row of memory cells 68. In addition, row address latch and decoder 52 provides sense amplifier activation signals and equalization and precharge signals to sense amplifier circuit 56 via communications path 72.

Column address latch and decoder 54 activates column select lines 70 to connect sense amplifiers in sense amplifier circuit 56 to RAM I/O circuit 58. Column address latch and decoder 54 receives a column address and latches the column address into column address latch and decoder 54. Column address latch and decoder 54 decodes the column address to select addressed column select lines 70. In addition, column address latch and decoder 54 receives column select line activation signals from control circuit 60 via control communications path 76. The column select line activation signals indicate which of the addressed column select lines 70 are to be activated by column address latch and decoder 54. Column address latch and decoder 54 activates column select lines 70 that are addressed by the column address and selected for activation by the column select line activation signals. Activated column select lines 70 are provided to sense amplifier circuit 56 to connect sense amplifiers in sense amplifier circuit 56 to RAM I/O circuit 58.

Control circuit 60 receives addresses and control signals from controller 42 via memory communications path 46. Controller 42 provides control signals, such as read/write enable, RAS, and CAS signals to control circuit 60. Control circuit 60 provides RAS signals to row address latch and decoder 52 and CAS signals to column address latch and decoder 54. Also, control circuit 60 provides control signals to column address latch and decoder 54 to selectively activate column select lines 70.

Controller 42 and RAM I/O circuit 58 communicate data signals and strobe signals between controller 42 and RAM 44 via data communications path 48. Controller 42 and RAM 44 are similar to chip 22 and chip 24 (shown in FIG. 1). RAM I/O circuit 58 includes a suitable number of transmitter and receiver pairs and controller 42 includes a suitable number of transmitter and receiver pairs. Each transmitter and receiver pair in RAM I/O circuit 58 corresponds to a transmitter and receiver pair in controller 42.

Data communications path 48 includes one or more signal pathways and each transmitter and receiver pair in I/O circuit 58 is electrically coupled to the corresponding transmitter and receiver pair in controller 42 via at least one of the signal pathways in data communications path 48.

RAM I/O circuit 58 includes an input circuit 80 that receives a strobe signal DQS at 82, a data signal DATA at 84, and a clock signal CLK at 86. Input circuit 80 is similar to input circuit 28 (shown in FIG. 1). Input circuit 80 samples data signal DATA at 84 via strobe signal DQS at 82 to provide sampled data bits. Input circuit 80 updates output signals to the sampled data bit values via an updating strobe signal. The updated output signals are clocked into RAM 44 via clock signal CLK at 86 to provide rising edge data bit signal RDATA at 88 and falling edge data bit signal FDATA at 90.

Input circuit 80 synchronizes the updating strobe signal and updating of the output signals to strobe signal DQS at 82 and clock signal CLK at 86. The output signals are updated after previously updated output signals have been clocked into RAM 44 via clock signal CLK at 86. Synchronizing the updating strobe signal to strobe signal DQS at 82 and clock signal CLK at 86 ensures that skew of strobe signal DQS at 82 and of the sampled data bits does not affect clocking of the sampled data bit values into RAM 44 via clock signal CLK at 86. Reliable communications between controller 42 and RAM 44 can be maintained with an increased number of data signals, such as data signal DATA at 84, sampled in parallel via one strobe signal, such as strobe signal DQS at 82, and with an increase in the input data bit and strobe signal speeds. In one embodiment, RAM 44 includes any suitable number of input circuits, such as input circuit 80, and RAM 44 receives any suitable number of data signals, such as data signal DATA at 84, and strobe signals, such as strobe signal DQS at 82, from controller 42 via data communications path 48.

Sense amplifier circuit 56 includes sense amplifiers, equalization and precharge circuits, and switches. The sense amplifiers are differential input sense amplifiers and each sense amplifier receives one bit line 66 at each of the two differential inputs. One of the bit lines 66 receives a data bit from a selected memory cell 68 and the other bit line 66 is used as a reference. The equalization and precharge circuits equalize the voltage on bit lines 66 connected to the same sense amplifier prior to a read or write operation.

To read a data bit, a sense amplifier amplifies the difference between the data bit value and the reference value and provides a sensed output value to RAM I/O circuit 58 via I/O communications path 74. One of the transmitter and receiver pairs in RAM I/O circuit 58 receives the sensed output value and provides the sensed output value to the corresponding transmitter and receiver pair in controller 42 via data communications path 48.

To write a data bit, one of the transmitter and receiver pairs in controller 42 provides a data signal to the corresponding transmitter and receiver pair in RAM I/O circuit 58 via data communications path 48. Also, one of the transmitter and receiver pairs in controller 42 provides a strobe signal to the corresponding transmitter and receiver pair in RAM I/O circuit 58 via data communications path 48. A receiver in RAM I/O circuit 58 receives the data signal and provides a received data signal to an input circuit, such as data signal DATA at 84 to input circuit 80. Another receiver in RAM I/O circuit 58 receives the strobe signal and provides a received strobe signal to the input circuit, such as strobe signal DQS at 82 to input circuit 80. Input circuit 80 receives data signal DATA at 84 and strobe signal DQS at 82 and samples data signal DATA at 84 via strobe signal DQS at 82 to provide sampled data bits. Input circuit 80 updates output signals to the sampled data bit values via an updating strobe signal. The updated output signals are clocked into RAM 44 via clock signal CLK at 86 to provide rising edge data bit signal RDATA at 88 and falling edge data bit signal FDATA at 90.

RAM I/O circuit 58 provides a data bit from one of the data bit signals, rising edge data bit signal RDATA at 88 and falling edge data bit signal FDATA at 90, to a sense amplifier in sense amplifier circuit 56 via I/O communications path 74. RAM I/O circuit 58 overdrives the sense amplifier to drive the data bit value onto the bit line 66 that is connected to one of the memory cells 68. RAM I/O circuit 58 also overdrives the inverse of the data bit value onto the reference bit line 66. The sense amplifier writes the received data bit value into the selected memory cell 68.

During a read operation, control circuit 60 receives read control signals and address register 62 receives the row address of a selected memory cell or cells 68. The row address is supplied from address register 62 to row address latch and decoder 52 and latched into row address latch and decoder 52 by control circuit 60 and a RAS signal. Row address latch and decoder 52 decodes the row address and activates the selected word line 64. As the selected word line 64 is activated, the value stored in each memory cell 68 coupled to the selected word line 64 is passed to the respective bit line 66. The bit value stored at a memory cell 68 is detected by a sense amplifier that is electrically coupled to the respective bit line 66.

Next, control circuit 60 and address register 62 receive the column address of the selected memory cell or cells 68. The column address is supplied from address register 62 to column address latch and decoder 54 and latched into column address latch and decoder 54 by control circuit 60 and a CAS signal. The column address latch and decoder 54 decodes the column address to select column select lines 70. Control circuit 60 provides control signals to column address latch and decoder 54 to selectively activate column select lines 70 and connect selected sense amplifiers to RAM I/O circuit 58. Sensed output values are provided to transmitter and receiver pairs in RAM I/O circuit 58 and provided to the corresponding transmitter and receiver pairs in controller 42 via data communications path 48.

During a write operation, control circuit 60 receives write control signals and address register 62 receives the row address of a selected memory cell or cells 68. The row address is supplied from address register 62 to row address latch and decoder 52 and latched into row address latch and decoder 52 by control circuit 60 and a RAS signal. The row address latch and decoder 52 decodes the row address and activates the selected word line 64. As the selected word line 64 is activated, the value stored in each memory cell 68 coupled to the selected word line 64 is passed to the respective bit line 66 and the sense amplifier that is electrically coupled to the respective bit line 66.

Data to be stored in the array of memory cells 50 is supplied from transmitter and receiver pairs in controller 42 to transmitter and receiver pairs in I/O circuit 58 via data communications path 48. Receivers in RAM I/O circuit 58 receive the data signals and provide received data signals, such as data signal DATA at 84, to input circuits, such as input circuit 80. Other receivers in RAM I/O circuit 58 receive strobe signals and provide received strobe signals, such as strobe signal DQS at 82, to the input circuits, such as input circuit 80. The input circuits receive the data signals and the strobe signals and sample the data signals via the strobe signals to provide sampled data bits. The input circuits update internal output signals to the sampled data bit values via updating strobe signals. The updated output signals are clocked into RAM 44 via clock signal CLK at 86 to provide rising edge data bit signals, such as rising edge data bit signal RDATA at 88, and falling edge data bit signals, such as falling edge data bit signal FDATA at 90.

Control circuit 60 and address register 62 receive the column address of the selected memory cell or cells 68. Address register 62 supplies the column address to column address latch and decoder 54 and the column address is latched into column address latch and decoder 54 by control circuit 60 and a CAS signal. Column address latch and decoder 54 receives column select line activation signals from control circuit 60 and activates selected column select lines 70 to connect sense amplifiers in sense amplifier circuit 56 to RAM I/O circuit 58. RAM I/O circuit 58 provides data bits from the rising edge data bit signals and the falling edge data bit signals to sense amplifiers in sense amplifier circuit 56 via I/O communications path 74. RAM I/O circuit 58 overdrives the sense amplifiers to write data to the selected memory cell or cells 68 via bit lines 66.

Figure 3:
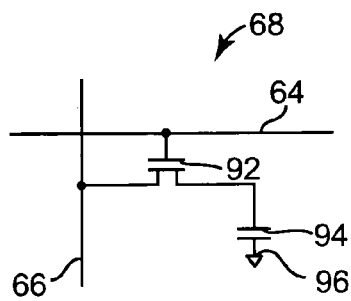
FIG. 3 is a diagram illustrating one embodiment of a memory cell in the array of memory cells.

FIG. 3 is a diagram illustrating one embodiment of a memory cell 68 in the array of memory cells 50. Memory cell 68 includes a transistor 92 and a capacitor 94. The gate of transistor 92 is electrically coupled to a word line 64. One side of the drain-source path of transistor 92 is electrically coupled to a bit line 66 and the other side of the drain-source path is electrically coupled to one side of capacitor 94. The other side of capacitor 94 is electrically coupled to a reference 96, such as one-half the supply voltage. Capacitor 94 is charged and discharged to represent a logic 0 or a logic 1.

During a read operation, word line 64 is activated to turn on transistor 92 and the value stored on capacitor 94 is read by a sense amplifier via bit line 66. During a write operation, word line 64 is activated to turn on transistor 92 to access capacitor 94. The sense amplifier connected to bit line 66 is overdriven to write a data value onto capacitor 94 via bit line 66 and transistor 92.

A read operation on memory cell 68 is a destructive read operation. After each read operation, capacitor 94 is recharged or discharged to the data value that was just read. In addition, even without a read operation, the charge on capacitor 94 discharges over time. To retain a stored value, memory cell 68 is refreshed periodically by reading and/or writing memory cell 68. All memory cells 68 in the array of memory cells 50 are periodically refreshed to maintain their values.

Figure 4:
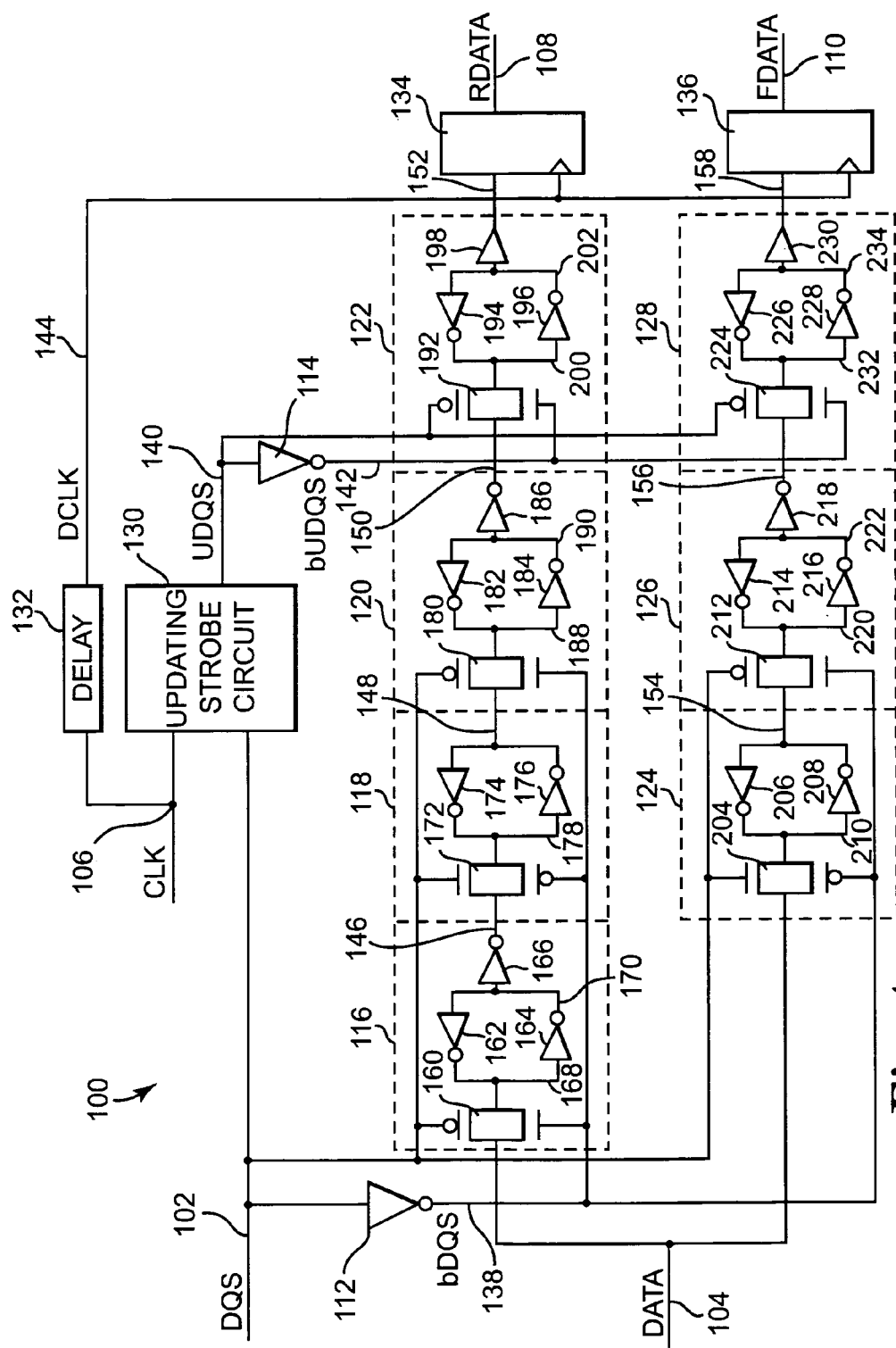
FIG. 4 is a diagram illustrating one embodiment of an input circuit for inputting data into an integrated circuit chip.

FIG. 4 is a diagram illustrating one embodiment of an input circuit 100 for inputting data into an integrated circuit chip. Input circuit 100 receives a strobe signal DQS at 102, a data signal DATA at 104, and a clock signal CLK at 106. Input circuit 100 is similar to input circuit 80 (shown in FIG. 2) and input circuit 28 (shown in FIG. 1). Input circuit 100 samples data signal DATA at 104 via strobe signal DQS at 102 to provide sampled data bits. Input circuit 100 updates internal output signals to the sampled data bit values via an updating strobe signal UDQS at 140 and an inverted updating strobe signal bUDQS at 142. The updated output signals are clocked into the integrated circuit chip via clock signal CLK at 106 and delayed clock DCLK at 144 to provide rising edge data bit signal RDATA at 108 and falling edge data bit signal FDATA at 110.

Input circuit 100 includes inverters 112 and 114, latches 116, 118, 120, 122, 124, 126, and 128, an updating strobe circuit 130, a clock delay circuit 132, and flip flops 134 and 136. Inverter 112 receives strobe signal DQS at 102 and provides inverted strobe signal bDQS at 138. Latches 116, 118, 120, 124, and 126 receive strobe signal DQS at 102 and inverted strobe signal bDQS at 138. Updating strobe circuit 130 receives strobe signal DQS at 102 and clock signal CLK at 106 and provides updating strobe signal UDQS at 140. Inverter 114 receives updating strobe signal UDQS at 140 and provides inverted updating strobe signal bUDQS at 142. Latches 122 and 128 receive updating strobe signal UDQS at 140 and inverted updating strobe signal bUDQS at 142. Clock delay circuit 132 receives clock signal CLK at 106 and provides delayed clock signal DCLK at 144. Flip-flops 134 and 136 receive delayed clock signal DCLK at 144.

Latches 116 and 124 receive data signal DATA at 104. Latch 116 is electrically coupled to latch 118 via data path 146. Latch 118 is electrically coupled to latch 120 via data path 148. Latch 120 is electrically coupled to latch 122 via data path 150, and latch 122 is electrically coupled to flip-flop 134 via data path 152. Flip-flop 134 provides rising edge data bit signal RDATA at 108. Latch 124 is electrically coupled to latch 126 via data path 154. Latch 126 is electrically coupled to latch 128 via data path 156, and latch 128 is electrically coupled to flip-flop 136 via data path 158. Flip-flop 136 provides falling edge data bit signal FDATA at 110. Latches 116, 118, 120, 122, 124, 126, and 128 can be any suitable type of latch, and flip-flops 134 and 136 can be any suitable type of flip-flop, such as a D-type flip-flop.

Latch 116 includes a transmission gate 160 and inverters 162, 164, and 166. Transmission gate 160 receives data signal DATA at 104 and is similar to a p-channel metal oxide semiconductor (PMOS) transistor in parallel with an n-channel metal oxide semiconductor (NMOS) transistor. Transmission gate 160 receives strobe signal DQS at 102 and inverted strobe signal bDQS at 138. Transmission gate 160 is turned on to conduct data signal DATA at 104 if strobe signal DQS at 102 is at a low voltage level and inverted strobe signal bDQS at 138 is at a high voltage level. Transmission gate 160 is turned off to not conduct data signal DATA at 104 if strobe signal DQS at 102 is at a high voltage level and inverted strobe signal bDQS at 138 is at a low voltage level.

Transmission gate 160 is electrically coupled to the output of inverter 162 and the input of inverter 164 via data path 168. The output of inverter 164 is electrically coupled to the input of inverter 162 and the input of inverter 166 via data path 170. The output of inverter 166 is electrically coupled to latch 118 via data path 146.

If strobe signal DQS at 102 is at a low voltage level and inverted strobe signal bDQS at 138 is at a high voltage level, transmission gate 160 is turned on to conduct data signal DATA at 104 and the logic level of data signal DATA at 104 passes to data path 168. Inverter 164 inverts the logic level on data path 168 to provide an inverted signal on data path 170. The inverted signal on data path 170 is inverted via inverter 162 to provide a non-inverted logic level on data path 168. Inverter 166 inverts the inverted signal on data path 170 to provide a non-inverted signal to latch 118 via data path 146. The data signal on data path 146 has the same logic level as data signal DATA at 104.

As strobe signal DQS at 102 rises in a transition from a low voltage level to a high voltage level and inverted strobe signal bDQS at 138 transitions from a high voltage level to a low voltage level, transmission gate 160 is turned off and data signal DATA at 104 is sampled by latch 116 to provide a rising edge data bit on data path 146. The logic level of the rising edge data bit is provided to latch 118.

Latch 118 includes a transmission gate 172 and inverters 174 and 176. Transmission gate 172 receives the logic level of the rising edge data bit on data path 146 and is similar to a PMOS transistor in parallel with an NMOS transistor. Transmission gate 172 receives strobe signal DQS at 102 and inverted strobe signal bDQS at 138. Transmission gate 172 is turned on to conduct the logic level of the rising edge data bit on data path 146 if strobe signal DQS at 102 is at a high voltage level and inverted strobe signal bDQS at 138 is at a low voltage level. Transmission gate 172 is turned off to not conduct the logic level of the rising edge data bit on data path 146 if strobe signal DQS at 102 is at a low voltage level and inverted strobe signal bDQS at 138 is at a high voltage level.

Transmission gate 172 is electrically coupled to the output of inverter 174 and the input of inverter 176 via data path 178. The output of inverter 176 is electrically coupled to the input of inverter 174 and latch 120 via data path 148.

As strobe signal DQS at 102 rises in a transition from a low voltage level to a high voltage level and inverted strobe signal bDQS at 138 transitions from a high voltage level to a low voltage level, transmission gate 160 is turned off to not conduct and data signal DATA at 104 is sampled by latch 116 to provide the rising edge data bit on data path 146. Also, transmission gate 172 is turned on to conduct the logic level of the rising edge data bit on data path 146, which passes to data path 178. Inverter 176 inverts the logic level of the rising edge data bit on data path 178 to provide an inverted rising edge data bit on data path 148. The inverted rising edge data bit on data path 148 is inverted via inverter 174 to provide the logic level of the rising edge data bit on data path 178. As strobe signal DQS at 102 falls in a transition from a high voltage level to a low voltage level and inverted strobe signal bDQS at 138 transitions from a low voltage level to a high voltage level, transmission gate 172 is turned off to not conduct and the inverted rising edge data bit on data path 148 is provided to latch 120.

Latch 120 includes a transmission gate 180 and inverters 182, 184, and 186. Transmission gate 180 receives the inverted rising edge data bit on data path 148 and is similar to a PMOS transistor in parallel with an NMOS transistor. Transmission gate 180 receives strobe signal DQS at 102 and inverted strobe signal bDQS at 138. Transmission gate 180 is turned on to conduct the inverted rising edge data bit on data path 148 if strobe signal DQS at 102 is at a low voltage level and inverted strobe signal bDQS at 138 is at a high voltage level. Transmission gate 180 is turned off to not conduct the inverted rising edge data bit on data path 148 if strobe signal DQS at 102 is at a high voltage level and inverted strobe signal bDQS at 138 is at a low voltage level.

Transmission gate 180 is electrically coupled to the output of inverter 182 and the input of inverter 184 via data path 188. The output of inverter 184 is electrically coupled to the input of inverter 182 and the input of inverter 186 via data path 190. The output of inverter 186 is electrically coupled to latch 122 via data path 150.

As strobe signal DQS at 102 falls in a transition from a high voltage level to a low voltage level and inverted strobe signal bDQS at 138 transitions from a low voltage level to a high voltage level, transmission gate 172 is turned off to not conduct and the inverted rising edge data bit on data path 148 is provided to latch 120. Also, transmission gate 180 is turned on to conduct the inverted rising edge data bit on data path 148, which passes to data path 188. Inverter 184 inverts the inverted rising edge data bit on data path 188 to provide the logic level of the rising edge data bit on data path 190. The logic level of the rising edge data bit on data path 190 is inverted via inverter 182 to provide the inverted rising edge data bit on data path 188. Inverter 186 inverts the logic level of the rising edge data bit on data path 190 to provide an inverted logic level of the rising edge data bit to latch 122 via data path 150. As strobe signal DQS at 102 rises in a transition from a low voltage level to a high voltage level and inverted strobe signal bDQS at 138 transitions from a high voltage level to a low voltage level, transmission gate 180 is turned off to not conduct and the inverted rising edge data bit on data path 150 is provided to latch 122.

Latch 122 includes a transmission gate 192, inverters 194 and 196, and a non-inverting buffer 198. Transmission gate 192 receives the inverted rising edge data bit on data path 150 and is similar to a PMOS transistor in parallel with an NMOS transistor. Transmission gate 192 receives updating strobe signal UDQS at 140 and inverted updating strobe signal bUDQS at 142. Transmission gate 192 is turned on to conduct the inverted rising edge data bit on data path 150 if updating strobe signal UDQS at 140 is at a low voltage level and inverted updating strobe signal bUDQS at 142 is at a high voltage level. Transmission gate 192 is turned off to not conduct the inverted rising edge data bit on data path 150 if updating strobe signal UDQS at 140 is at a high voltage level and inverted updating strobe signal bUDQS at 142 is at a low voltage level.

Transmission gate 192 is electrically coupled to the output of inverter 194 and the input of inverter 196 via data path 200. The output of inverter 196 is electrically coupled to the input of inverter 194 and the input of non-inverting buffer 198 via data path 202. The output of non-inverting buffer 198 is electrically coupled to the data input of flip-flop 134 via data path 152.

As updating strobe signal UDQS at 140 falls in a transition from a high voltage level to a low voltage level and inverted updating strobe signal bUDQS at 142 transitions from a low voltage level to a high voltage level, transmission gate 192 is turned on to conduct the inverted rising edge data bit on data path 150, which passes to data path 200. Inverter 196 inverts the inverted rising edge data bit on data path 200 to provide the logic level of the rising edge data bit on data path 202. The rising edge data bit on data path 202 is inverted via inverter 194 to provide the inverted rising edge data bit logic level on data path 200. Non-inverting buffer 198 receives the logic level of the rising edge data bit on data path 202 and updates a rising edge data bit output signal on data path 152. The updated rising edge data bit output signal is provided to the data input of flip-flop 134 via data path 152. As updating strobe signal UDQS at 140 rises in a transition from a low voltage level to a high voltage level and inverted updating strobe signal bUDQS at 142 transitions from a high voltage level to a low voltage level, transmission gate 192 is turned off to not conduct.

Latch 124 includes a transmission gate 204 and inverters 206 and 208. Transmission gate 204 receives data signal DATA at 104 and is similar to a PMOS transistor in parallel with an NMOS transistor. Transmission gate 204 receives strobe signal DQS at 102 and inverted strobe signal bDQS at 138. Transmission gate 204 is turned on to conduct data signal DATA at 104 if strobe signal DQS at 102 is at a high voltage level and inverted strobe signal bDQS at 138 is at a low voltage level. Transmission gate 204 is turned off to not conduct data signal DATA at 104 if strobe signal DQS at 102 is at a low voltage level and inverted strobe signal bDQS at 138 is at a high voltage level.

Transmission gate 204 is electrically coupled to the output of inverter 206 and the input of inverter 208 via data path 210. The output of inverter 208 is electrically coupled to the input of inverter 206 and latch 126 via data path 154.

As strobe signal DQS at 102 rises in a transition from a low voltage level to a high voltage level and inverted strobe signal bDQS at 138 transitions from a high voltage level to a low voltage level, transmission gate 204 is turned on to conduct data signal DATA at 104, which passes to data path 210. Inverter 208 inverts the logic level of data signal DATA at 104 on data path 210 to provide an inverted logic level of data signal DATA at 104 on data path 154. The inverted logic level of data signal DATA at 104 on data path 154 is inverted via inverter 206 to provide the logic level of data signal DATA at 104 on data path 210. As strobe signal DQS at 102 falls in a transition from a high voltage level to a low voltage level and inverted strobe signal bDQS at 138 transitions from a low voltage level to a high voltage level, transmission gate 204 is turned off and data signal DATA at 104 is sampled by latch 124 to provide a falling edge data bit on data path 210. The inverted logic level of the falling edge data bit is provided to latch 126.

Latch 126 includes a transmission gate 212 and inverters 214, 216, and 218. Transmission gate 212 receives the inverted falling edge data bit on data path 154 and is similar to a PMOS transistor in parallel with an NMOS transistor. Transmission gate 212 receives strobe signal DQS at 102 and inverted strobe signal bDQS at 138. Transmission gate 212 is turned on to conduct the inverted falling edge data bit on data path 154 if strobe signal DQS at 102 is at a low voltage level and inverted strobe signal bDQS at 138 is at a high voltage level. Transmission gate 212 is turned off to not conduct the inverted falling edge data bit on data path 154 if strobe signal DQS at 102 is at a high voltage level and inverted strobe signal bDQS at 138 is at a low voltage level.

Transmission gate 212 is electrically coupled to the output of inverter 214 and the input of inverter 216 via data path 220. The output of inverter 216 is electrically coupled to the input of inverter 214 and the input of inverter 218 via data path 222. The output of inverter 218 is electrically coupled to latch 128 via data path 156.

As strobe signal DQS at 102 falls in a transition from a high voltage level to a low voltage level and inverted strobe signal bDQS at 138 transitions from a low voltage level to a high voltage level, transmission gate 204 is turned off to not conduct and the inverted falling edge data bit on data path 154 is provided to latch 126. Also, transmission gate 212 is turned on to conduct the inverted falling edge data bit on data path 154, which passes to data path 220. Inverter 216 inverts the inverted falling edge data bit on data path 220 to provide the logic level of the falling edge data bit on data path 222. The logic level of the falling edge data bit on data path 222 is inverted via inverter 214 to provide the inverted falling edge data bit on data path 220. Inverter 218 inverts the logic level of the falling edge data bit on data path 222 to provide an inverted logic level of the falling edge data bit to latch 128 via data path 156. As strobe signal DQS at 102 rises in a transition from a low voltage level to a high voltage level and inverted strobe signal bDQS at 138 transitions from a high voltage level to a low voltage level, transmission gate 212 is turned off to not conduct and the inverted falling edge data bit on data path 156 is provided to latch 128.

Latch 128 includes a transmission gate 224, inverters 226 and 228, and a non-inverting buffer 230. Transmission gate 224 receives the inverted falling edge data bit on data path 156 and is similar to a PMOS transistor in parallel with an NMOS transistor. Transmission gate 224 receives updating strobe signal UDQS at 140 and inverted updating strobe signal bUDQS at 142. Transmission gate 224 is turned on to conduct the inverted falling edge data bit on data path 156 if updating strobe signal UDQS at 140 is at a low voltage level and inverted updating strobe signal bUDQS at 142 is at a high voltage level. Transmission gate 224 is turned off to not conduct the inverted falling edge data bit on data path 156 if updating strobe signal UDQS at 140 is at a high voltage level and inverted updating strobe signal bUDQS at 142 is at a low voltage level.

Transmission gate 224 is electrically coupled to the output of inverter 226 and the input of inverter 228 via data path 232. The output of inverter 228 is electrically coupled to the input of inverter 226 and the input of non-inverting buffer 230 via data path 234. The output of non-inverting buffer 230 is electrically coupled to the data input of flip-flop 136 via data path 158.

As updating strobe signal UDQS at 140 falls in a transition from a high voltage level to a low voltage level and inverted updating strobe signal bUDQS at 142 transitions from a low voltage level to a high voltage level, transmission gate 224 is turned on to conduct the inverted falling edge data bit on data path 156, which passes to data path 232. Inverter 228 inverts the inverted falling edge data bit on data path 232 to provide the logic level of the falling edge data bit on data path 234. The falling edge data bit on data path 234 is inverted via inverter 226 to provide the inverted falling edge data bit logic level on data path 232. Non-inverting buffer 230 receives the logic level of the falling edge data bit on data path 234 and updates a falling edge data bit output signal on data path 158. The updated falling edge data bit output signal is provided to the data input of flip-flop 136 via data path 158. As updating strobe signal UDQS at 140 rises in a transition from a low voltage level to a high voltage level and inverted updating strobe signal bUDQS at 142 transitions from a high voltage level to a low voltage level, transmission gate 224 is turned off to not conduct.

Updating strobe circuit 130 receives strobe signal DQS at 102 and clock signal CLK at 106 and provides updating strobe signal UDQS at 140. The rising edge data bit output signal on data path 152 and the falling edge data bit output signal on data path 158 are updated via a falling edge of updating strobe signal UDQS at 140 and a rising edge of inverted updating strobe signal bUDQS at 142. Updating strobe circuit 130 synchronizes updating of the rising edge data bit output signal on data path 152 and the falling edge data bit output signal on data path 158 to strobe signal DQS at 102 and clock signal CLK at 106. In one embodiment, the falling edge of updating strobe signal UDQS at 140 occurs in response to either the falling edge of strobe signal DQS at 102 or a delayed rising edge of clock signal CLK at 106, whichever occurs later after a rising edge of clock signal CLK at 106. The delayed rising edge of clock signal CLK at 106 is a signal provided inside updating strobe circuit 130 and not shown in FIG. 4.

A rising edge in delayed clock signal DCLK at 144 clocks the rising edge data bit output signal on data path 152 into flip-flop 134 to provide rising edge data signal RDATA at 108 and the falling edge data bit output signal on data path 158 into flip-flop 136 to provide falling edge data signal FDATA at 110. Clocking via the rising edge in delayed clock signal DCLK at 144 and updating via a falling edge of updating strobe signal UDQS at 140 occur at different times. In one embodiment, the falling edge of updating strobe signal UDQS at 140 occurs in response to either the falling edge of strobe signal DQS at 102 or the delayed rising edge of clock signal CLK at 106, whichever occurs later after a rising edge of clock signal CLK at 106, and the delayed rising edge of clock signal CLK at 106 inside updating strobe circuit 130 occurs after the rising edge of delayed clock signal CLK at 144 in the clock cycle beginning with the rising edge of clock signal CLK at 106.

In operation, transmission gate 160 and transmission gate 204 receive data signal DATA at 104. If strobe signal DQS at 102 is at a low voltage level and inverted strobe signal bDQS at 138 is at a high voltage level, transmission gate 160 is turned on to conduct data signal DATA at 104 and transmission gate 204 is turned off to block data signal DATA at 104. The logic level of data signal DATA at 104 passes to data path 146 via transmission gate 160.

As strobe signal DQS at 102 rises in a transition from a low voltage level to a high voltage level and inverted strobe signal bDQS at 138 transitions from a high voltage level to a low voltage level, transmission gate 160 is turned off and data signal DATA at 104 is sampled by latch 116 to provide a strobe signal rising edge data bit on data path 146. The logic level of the rising edge data bit is provided to latch 118 and transmission gate 172. Also, transmission gate 172 is turned on to conduct the logic level of the rising edge data bit on data path 146. Inverter 176 inverts the logic level of the rising edge data bit to provide an inverted rising edge data bit on data path 148. In addition, transmission gate 204 is turned on to conduct data signal DATA at 104. Inverter 208 inverts the logic level of data signal DATA at 104 to provide an inverted logic level of data signal DATA at 104 on data path 154.

As strobe signal DQS at 102 falls in a transition from a high voltage level to a low voltage level and inverted strobe signal bDQS at 138 transitions from a low voltage level to a high voltage level, transmission gate 172 is turned off to not conduct and the inverted rising edge data bit on data path 148 is provided to latch 120 and transmission gate 180. Transmission gate 180 is turned on to conduct the inverted rising edge data bit on data path 148. The inverted logic level of the rising edge data bit is provided to latch 122 and transmission gate 192 via data path 150.

Also, as strobe signal DQS at 102 falls in a transition from a high voltage level to a low voltage level and inverted strobe signal bDQS at 138 transitions from a low voltage level to a high voltage level, transmission gate 204 is turned off and data signal DATA at 104 is sampled by latch 124 to provide a strobe signal falling edge data bit on data path 210. The inverted logic level of the falling edge data bit is provided to latch 126 and transmission gate 212. Transmission gate 212 is turned on to conduct the inverted falling edge data bit on data path 154. The inverted logic level of the falling edge data bit is provided to latch 128 and transmission gate 224 via data path 156.

In addition, transmission gate 160 is turned on to conduct data signal DATA at 104. The logic level of data signal DATA at 104 passes to data path 146 via transmission gate 160. Data signal DATA at 104 is sampled at the next rising edge of strobe signal DQS at 102 to get the next rising edge data bit.

As strobe signal DQS at 102 rises in a transition from a low voltage level to a high voltage level and inverted strobe signal bDQS at 138 transitions from a high voltage level to a low voltage level, transmission gate 180 is turned off to not conduct and the inverted rising edge data bit on data path 150 is provided to latch 122. Also, transmission gate 212 is turned off to not conduct and the inverted falling edge data bit on data path 156 is provided to latch 128.

In addition, transmission gate 160 is turned off and data signal DATA at 104 is sampled by latch 116 to provide the next rising edge data bit on data path 146 and transmission gate 172 is turned on to conduct the logic level of the next rising edge data bit on data path 146. Inverter 176 inverts the logic level of the next rising edge data bit to provide an inverted rising edge data bit on data path 148. Transmission gate 204 is turned on to conduct data signal DATA at 104 and inverter 208 inverts the logic level of data signal DATA at 104 to provide an inverted logic level of data signal DATA at 104 on data path 154. At the next falling edge of strobe signal DQS at 102, latch 124 samples data signal DATA at 104 to provide the next falling edge data bit.

Updating strobe circuit 130 provides a falling edge in updating strobe signal UDQS at 140 to update the rising edge data bit output signal on data path 152 and the falling edge data bit output signal on data path 158. As updating strobe signal UDQS at 140 falls in a transition from a high voltage level to a low voltage level and inverted updating strobe signal bUDQS at 142 transitions from a low voltage level to a high voltage level, transmission gate 192 is turned on to conduct the inverted rising edge data bit on data path 150. Inverter 196 inverts the inverted rising edge data bit to provide the logic level of the rising edge data bit on data path 202. Non-inverting buffer 198 receives the logic level of the rising edge data bit on data path 202 and updates the rising edge data bit output signal on data path 152. The updated rising edge data bit output signal is provided to the data input of flip-flop 134 via data path 152. Also, transmission gate 224 is turned on to conduct the inverted falling edge data bit on data path 156. Inverter 228 inverts the inverted falling edge data bit to provide the logic level of the falling edge data bit on data path 234. Non-inverting buffer 230 receives the logic level of the falling edge data bit on data path 234 and updates the falling edge data bit output signal on data path 158. The updated falling edge data bit output signal is provided to the data input of flip-flop 136 via data path 158.

As updating strobe signal UDQS at 140 rises in a transition from a low voltage level to a high voltage level and inverted updating strobe signal bUDQS at 142 transitions from a high voltage level to a low voltage level, transmission gate 192 is turned off to not conduct and transmission gate 224 is turned off to not conduct.

A rising edge in delayed clock signal DCLK at 144 clocks the rising edge data bit output signal on data path 152 into flip-flop 134 to provide rising edge data signal RDATA at 108 and the falling edge data bit output signal on data path 158 into flip-flop 136 to provide falling edge data signal FDATA at 110.

In one embodiment, the falling edge of updating strobe signal UDQS at 140 occurs in response to either the falling edge of strobe signal DQS at 102 or a delayed rising edge of clock signal CLK at 106, whichever occurs later after a rising edge of clock signal CLK at 106. The delayed rising edge of clock signal CLK at 106 is a signal provided inside updating strobe circuit 130 and not shown in FIG. 4. The delayed rising edge of clock signal CLK at 106 inside updating strobe circuit 130 occurs after the rising edge of delayed clock signal CLK at 144 in the clock cycle beginning with the rising edge of clock signal CLK at 106.

Updating the rising edge data bit output signal on data path 152 and the falling edge data bit output signal on data path 158 is synchronized to strobe signal DQS at 102 and clock signal CLK at 106 to ensure that the skew of strobe signal DQS at 102 and of sampled data bits does not affect clocking the sampled data bits into the integrated circuit chip via clock signal CLK at 106. Reliable communications can be maintained with an increased number of data signals sampled in parallel via one strobe signal, and with an increase in the input data bit and strobe signal speeds.

Figure 5:
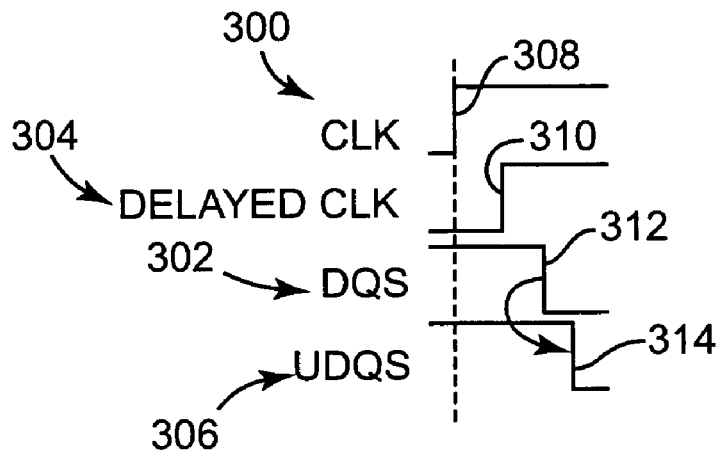
FIG. 5 is a timing diagram illustrating one example operation of one embodiment of an updating strobe circuit.

FIG. 5 is a timing diagram illustrating one example operation of one embodiment of updating strobe circuit 130 (shown in FIG. 4). Updating strobe circuit 130 receives clock signal CLK at 300 and strobe signal DQS at 302. Updating strobe circuit 130 delays clock signal CLK at 300 to provide delayed clock signal DELAYED CLK at 304 inside updating strobe circuit 130 and not shown in FIG. 4. Updating strobe circuit 130 provides updating strobe signal UDQS at 306 to update the rising edge data bit output signal on data path 152 and the falling edge data bit output signal on data path 158.

Updating strobe circuit 130 receives a rising edge at 308 in clock signal CLK at 300 and provides a rising edge at 310 in delayed clock signal DELAYED CLK at 304. In this example, a falling edge at 312 in strobe signal DQS at 302 occurs after the rising edge at 310 in delayed clock signal DELAYED CLK at 304. The falling edge at 312 in strobe signal DQS at 302 occurs later after the rising edge at 308 of clock signal CLK at 300, than the rising edge at 310 in delayed clock signal DELAYED CLK at 304.

Updating strobe circuit 130 provides a falling edge at 314 in updating strobe signal UDQS at 306 in response to the falling edge at 312 in strobe signal DQS at 302. The rising edge data bit sample on data path 150 and the falling edge data bit sample on data path 156 are updated at the falling edge at 312 in strobe signal DQS at 302. The rising edge data bit output signal on data path 152 and the falling edge data bit output signal on data path 158 are updated at the falling edge at 314 in updating strobe signal UDQS at 306.

A rising edge in delayed clock signal DCLK at 144 clocks the rising edge data bit output signal on data path 152 into flip-flop 134 to provide rising edge data signal RDATA at 108 and the falling edge data bit output signal on data path 158 into flip-flop 136 to provide falling edge data signal FDATA at 110. A rising edge in delayed clock signal DCLK at 144 can occur either before the falling edge at 314 in updating strobe signal UDQS at 306 or after the falling edge at 314 in updating strobe signal UDQS at 306.

In one embodiment, the rising edge of delayed clock signal CLK at 144 occurs between the rising edge at 308 in clock signal CLK at 300 and the rising edge at 310 in delayed clock signal DELAYED CLK at 304. The rising edge data bit output signal on data path 152 and the falling edge data bit output signal on data path 158 are updated at the falling edge at 314 in updating strobe signal UDQS at 306 after the rising edge in delayed clock signal DCLK at 144 clocks flip-flop 134 to provide rising edge data signal RDATA at 108 and flip-flop 136 to provide falling edge data signal FDATA at 110.

Figure 6:
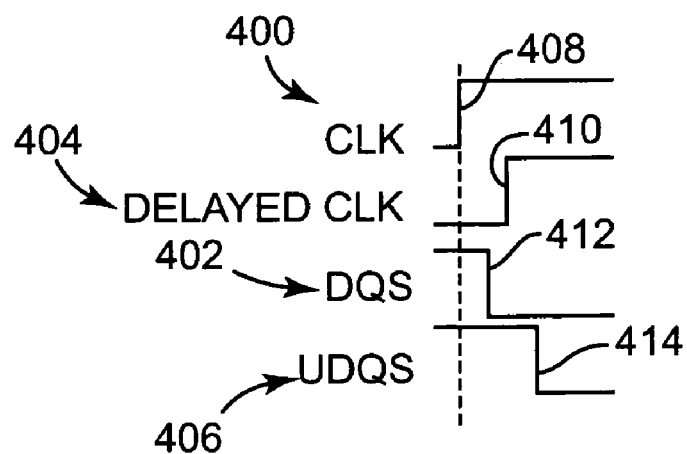
FIG. 6 is a timing diagram illustrating another example operation of one embodiment of an updating strobe circuit.

FIG. 6 is a timing diagram illustrating another example operation of one embodiment of updating strobe circuit 130 (shown in FIG. 4). Updating strobe circuit 130 receives clock signal CLK at 400 and strobe signal DQS at 402. Updating strobe circuit 130 delays clock signal CLK at 400 to provide delayed clock signal DELAYED CLK at 404 inside updating strobe circuit 130 and not shown in FIG. 4. Updating strobe circuit 130 provides updating strobe signal UDQS at 406 to update the rising edge data bit output signal on data path 152 and the falling edge data bit output signal on data path 158.

Updating strobe circuit 130 receives a rising edge at 408 in clock signal CLK at 400 and provides a rising edge at 410 in delayed clock signal DELAYED CLK at 404. In this example, a falling edge at 412 in strobe signal DQS at 402 occurs before the rising edge at 410 in delayed clock signal DELAYED CLK at 404. The rising edge at 410 in delayed clock signal DELAYED CLK at 404 occurs later after the rising edge at 408 of clock signal CLK at 400 than the falling edge at 412 in strobe signal DQS at 402.

Updating strobe circuit 130 provides a falling edge at 414 in updating strobe signal UDQS at 406 in response to the rising edge at 410 in delayed clock signal DELAYED CLK at 404. The rising edge data bit sample on data path 150 and the falling edge data bit sample on data path 156 are updated at the falling edge at 412 in strobe signal DQS at 402. However, the rising edge data bit output signal on data path 152 and the falling edge data bit output signal on data path 158 are updated at the falling edge at 414 in updating strobe signal UDQS at 406.

A rising edge in delayed clock signal DCLK at 144 clocks the rising edge data bit output signal on data path 152 into flip-flop 134 to provide rising edge data signal RDATA at 108 and the falling edge data bit output signal on data path 158 into flip-flop 136 to provide falling edge data signal FDATA at 110. A rising edge in delayed clock signal DCLK at 144 can occur either before the falling edge at 414 in updating strobe signal UDQS at 406 or after the falling edge at 414 in updating strobe signal UDQS at 406.

In one embodiment, the rising edge of delayed clock signal CLK at 144 occurs between the rising edge at 408 in clock signal CLK at 400 and the rising edge at 410 in delayed clock signal DELAYED CLK at 404. The rising edge data bit output signal on data path 152 and the falling edge data bit output signal on data path 158 are updated at the falling edge at 414 in updating strobe signal UDQS at 406 after the rising edge in delayed clock signal DCLK at 144 clocks flip-flop 134 to provide rising edge data signal RDATA at 108 and flip-flop 136 to provide falling edge data signal FDATA at 110.

Figure 7:
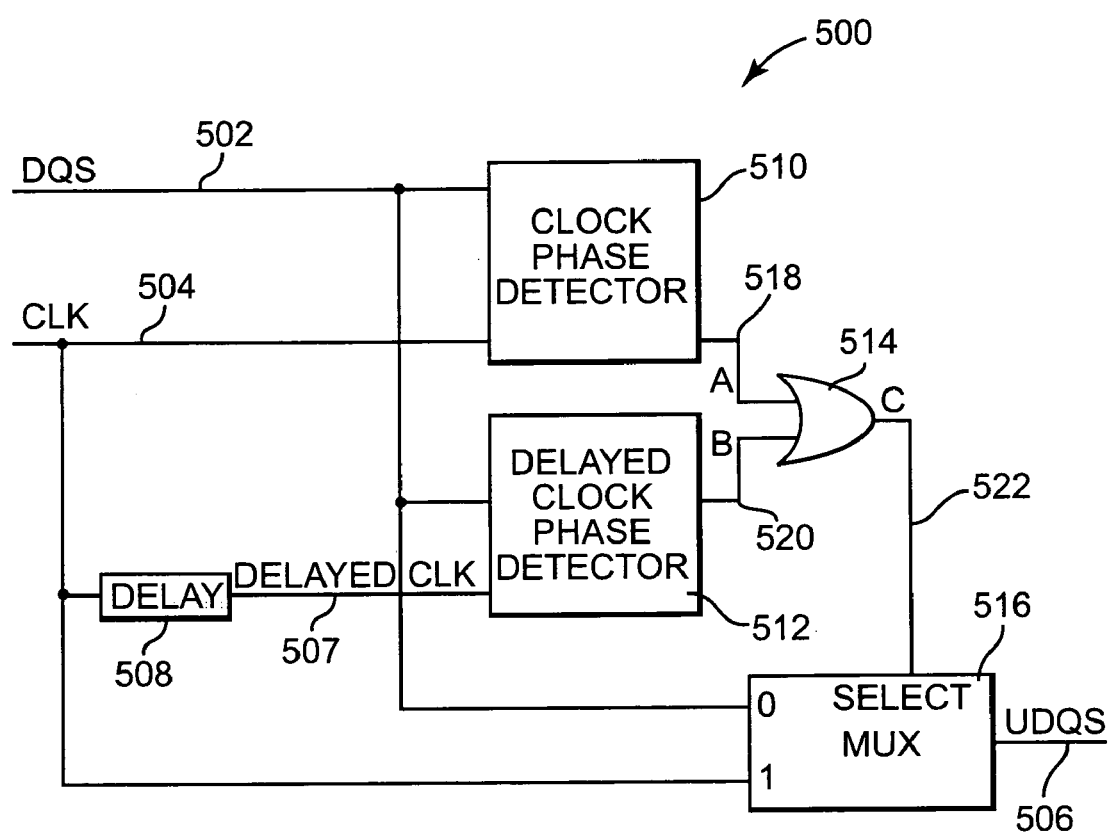
FIG. 7 is a diagram illustrating one embodiment of an updating strobe circuit.

FIG. 7 is a diagram illustrating one embodiment of an updating strobe circuit 500. Updating strobe circuit 500 is similar to updating strobe circuit 130 (shown in FIG. 4). Updating strobe circuit 500 receives strobe signal DQS at 502 and clock signal CLK at 504 and provides updating strobe signal UDQS at 506. The falling edge of updating strobe signal UDQS at 506 can be used to update output signals that are clocked into an integrated circuit. In one embodiment, the output signals are clocked into flip-flops, such as flip-flops 134 and 136 (shown in FIG. 4), via a delayed clock signal, such as delayed clock signal DCLK at 144, to provide a rising edge data signal, such as rising edge data signal RDATA at 108, and a falling edge data signal, such as falling edge data signal FDATA at 110.

Updating strobe circuit 500 synchronizes the falling edge of updating strobe signal UDQS at 506 to strobe signal DQS at 502 and clock signal CLK at 504. Also, the falling edge of updating strobe signal UDQS at 506 can be synchronized to clocking the updated output signals into the integrated circuit. The falling edge of updating strobe signal UDQS at 506 occurs in response to either the falling edge of strobe signal DQS at 502 or a rising edge in delayed clock signal DELAYED CLK at 507, whichever occurs later after a rising edge of clock signal CLK at 504. In one embodiment, the falling edge of updating strobe signal UDQS at 506 occurs in response to either the falling edge of strobe signal DQS at 502 or a rising edge in delayed clock signal DELAYED CLK at 507, whichever occurs later after a rising edge of clock signal CLK at 504, and the rising edge of delayed clock signal DELAYED CLK at 507 occurs after clocking the updated output signals into the integrated circuit during the clock cycle beginning with the rising edge of clock signal CLK at 504.

Updating strobe circuit 500 includes a delay circuit 508, a clock phase detector 510, a delayed clock phase detector 512, an OR gate 514, and a multiplexer 516. Delay circuit 508 is electrically coupled to delayed clock phase detector 512 via clock path 507. Delay circuit 508 receives clock signal CLK at 504 and provides delayed clock signal DELAYED CLK at 507 to delayed clock phase detector 512 via clock path 507.

Clock phase detector 510 is electrically coupled to one input of OR gate 514 via communications path 518 and delayed clock phase detector 512 is electrically coupled to the other input of OR gate 514 via communications path 520. Clock phase detector 510 receives strobe signal DQS at 502 and clock signal CLK at 504 and provides phase detector output signal A at 518 to OR gate 514 via communications path 518. Delayed clock phase detector 512 receives strobe signal DQS at 502 and delayed clock signal DELAYED CLK at 507 and provides phase detector output signal B at 520 to OR gate 514 via communications path 520. The output of OR gate 514 is electrically coupled to the select input of multiplexer 516 via select input path 522. OR gate 514 receives phase detector output signal A at 518 and phase detector output signal B at 520 and performs an OR function on the inputs to provide select input signal C at 522 to the select input of multiplexer 516 via select input path 522.

Multiplexer 516 receives strobe signal DQS at 502 and clock signal CLK at 504. The zero (0) input of multiplexer 516 receives strobe signal DQS at 502 and the one (1) input of multiplexer 516 receives clock signal CLK at 504. Multiplexer 516 selects between strobe signal DQS at 502 and clock signal CLK at 504 based on the logic value of select input signal C at 522. If select input signal C at 522 is at a logic zero, multiplexer 516 selects strobe signal DQS at 502 and provides the logic level of strobe signal DQS at 502 as updating strobe signal UDQS at 506. If select input signal C at 522 is at a logic one, multiplexer 516 selects clock signal CLK at 504 and provides the logic level of clock signal CLK at 504 as updating strobe signal UDQS at 506.

Clock phase detector 510 detects the phase difference between strobe signal DQS at 502 and clock signal CLK at 504. If the logic levels of strobe signal DQS at 502 and clock signal CLK at 504 are the same, clock phase detector 510 provides a logic one as phase detector output signal A at 518. If the logic levels of strobe signal DQS at 502 and clock signal CLK at 504 are different, clock phase detector 510 provides a logic zero as phase detector output signal A at 518. In one embodiment, clock phase detector 510 is an EXCLUSIVE NOR gate.

Delayed clock phase detector 512 detects the phase difference between strobe signal DQS at 502 and delayed clock signal DELAYED CLK at 507. If the logic levels of strobe signal DQS at 502 and delayed clock signal DELAYED CLK at 507 are the same, delayed clock phase detector 512 provides a logic one as phase detector output signal B at 520. If the logic levels of strobe signal DQS at 502 and delayed clock signal DELAYED CLK at 507 are different, delayed clock phase detector 512 provides a logic zero as phase detector output signal B at 520. In one embodiment, delayed clock phase detector 512 is an EXCLUSIVE NOR gate.

In operation, clock phase detector 510 detects the phase difference between strobe signal DQS at 502 and clock signal CLK at 504 and provides the EXCLUSIVE NOR result as phase detector output signal A at 518. Delayed clock phase detector 512 detects the phase difference between strobe signal DQS at 502 and delayed clock signal DELAYED CLK at 507 and provides the EXCLUSIVE NOR result as phase detector output signal B at 520. OR gate 514 performs an OR function on phase detector output signal A at 518 and phase detector output signal B at 520 and provides select input signal C at 522 to the select input of multiplexer 516. Multiplexer 516 selects between strobe signal DQS at 502 and clock signal CLK at 504 based on the logic value of select input signal C at 522 to provide updating strobe signal UDQS at 506. The falling edge of updating strobe signal UDQS at 506 occurs in response to either the falling edge of strobe signal DQS at 502 or a rising edge in delayed clock signal DELAYED CLK at 507, whichever occurs later after a rising edge of clock signal CLK at 504.

Figure 8:
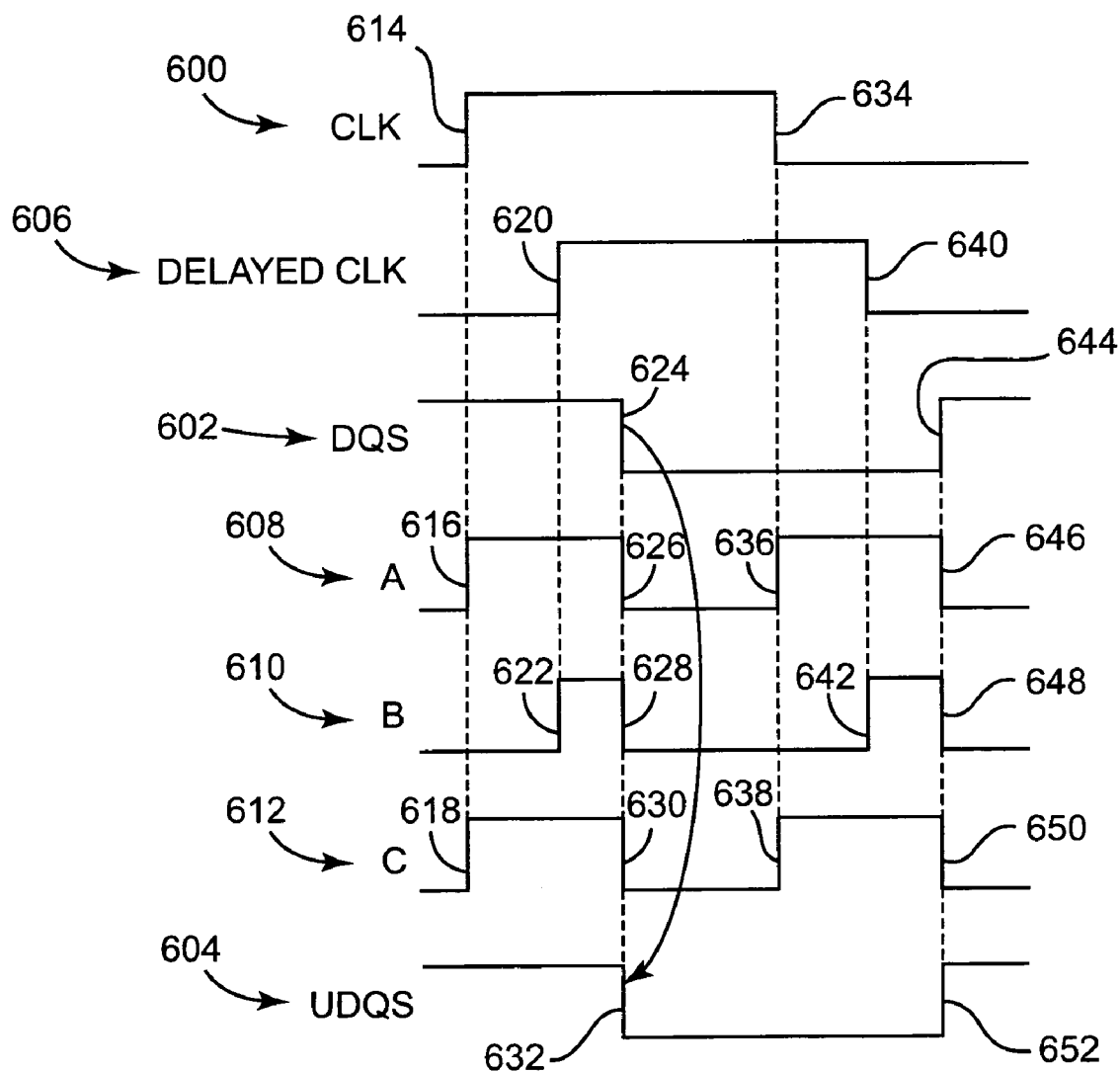
FIG. 8 is a timing diagram illustrating an example operation of the updating strobe circuit of FIG. 7.

FIG. 8 is a timing diagram illustrating an example operation of updating strobe circuit 500 of FIG. 7. Updating strobe circuit 500 receives clock signal CLK at 600 and strobe signal DQS at 602 and provides updating strobe signal UDQS at 604. Delay circuit 508 delays clock signal CLK at 600 to provide delayed clock signal DELAYED CLK at 606. Clock phase detector 510 receives clock signal CLK at 600 and strobe signal DQS at 602 and provides phase detector output signal A at 608. Delayed clock phase detector 512 receives strobe signal DQS at 602 and delayed clock signal DELAYED CLK at 606 and provides phase detector output signal B at 610. OR gate 514 receives phase detector output signal A at 608 and phase detector output signal B at 610 and performs an OR function on the inputs to provide select input signal C at 612 to the select input of multiplexer 516. Multiplexer 516 selects between clock signal CLK at 600 and strobe signal DQS at 602 based on select input signal C at 612 to provide updating strobe signal UDQS at 604.

To begin, clock phase detector 510 performs an EXCLUSIVE NOR function on a low logic level in clock signal CLK at 600 and a high logic level in strobe signal DQS at 602 and provides a low logic level in phase detector output signal A at 608. Delayed clock phase detector 512 performs an EXCLUSIVE NOR function on a low logic level in delayed clock signal DELAYED CLK at 606 and a high logic level in strobe signal DQS at 602 and provides a low logic level in phase detector output signal B at 610. OR gate 514 receives the low logic level in phase detector output signal A at 608 and the low logic level in phase detector output signal B at 610 and provides a low logic level in select input signal C at 612. Multiplexer 516 receives the low logic level in select input signal C at 612 and selects strobe signal DQS at 602. The high logic level in strobe signal DQS at 602 is provided as a high logic level in updating strobe signal UDQS at 604.

Clock phase detector 510 receives a rising edge at 614 in clock signal CLK at 600 and performs an EXCLUSIVE NOR function on the subsequent high logic level in clock signal CLK at 600 and the high logic level in strobe signal DQS at 602 to provide a rising edge at 616 in phase detector output signal A at 608. OR gate 514 receives the rising edge at 616 in phase detector output signal A at 608 and provides a rising edge at 618 in select input signal C at 612. Multiplexer 516 receives the high logic level in select input signal C at 612 and selects clock signal CLK at 600. The high logic level in clock signal CLK at 600 is provided as a high logic level in updating strobe signal UDQS at 604.

Delayed clock phase detector 512 receives a rising edge at 620 in delayed clock signal DELAYED CLK at 606 and performs an EXCLUSIVE NOR function on the subsequent high logic level in delayed clock signal DELAYED CLK at 606 and the high logic level in strobe signal DQS at 602 to provide a rising edge at 622 in phase detector output signal B at 610. OR gate 514 receives the rising edge at 622 in phase detector output signal B at 610 and continues to provide a high logic level in select input signal C at 612. Multiplexer 516 receives the high logic level in select input signal C at 612 and continues selecting clock signal CLK at 600. The high logic level in clock signal CLK at 600 is provided as a high logic level in updating strobe signal UDQS at 604.

Clock phase detector 510 receives a falling edge at 624 in strobe signal DQS at 602 and performs an EXCLUSIVE NOR function on the subsequent low logic level in strobe signal DQS at 602 and the high logic level in clock signal CLK at 600 to provide a falling edge at 626 in phase detector output signal A at 608. Also, delayed clock phase detector 512 receives the falling edge at 624 in strobe signal DQS at 602 and performs an EXCLUSIVE NOR function on the subsequent low logic level in strobe signal DQS at 602 and the high logic level in delayed clock signal DELAYED CLK at 606 to provide a falling edge at 628 in phase detector output signal B at 610. OR gate 514 receives the falling edge at 626 in phase detector output signal A at 608 and the falling edge at 628 in phase detector output signal B at 610 and provides a falling edge at 630 in select input signal C at 612. Multiplexer 516 receives the low logic level in select input signal C at 612 and selects strobe signal DQS at 602. The low logic level in strobe signal DQS at 602 is provided as a falling edge at 632 and a low logic level in updating strobe signal UDQS at 604.

Next, clock phase detector 510 receives a falling edge at 634 in clock signal CLK at 600 and performs an EXCLUSIVE NOR function on the subsequent low logic level in clock signal CLK at 600 and the low logic level in strobe signal DQS at 602 to provide a rising edge at 636 in phase detector output signal A at 608. OR gate 514 receives the rising edge at 636 in phase detector output signal A at 608 and provides a rising edge at 638 in select input signal C at 612. Multiplexer 516 receives the high logic level in select input signal C at 612 and selects clock signal CLK at 600. The low logic level in clock signal CLK at 600 is provided as a low logic level in updating strobe signal UDQS at 604.

Delayed clock phase detector 512 receives a falling edge at 640 in delayed clock signal DELAYED CLK at 606 and performs an EXCLUSIVE NOR function on the subsequent low logic level in delayed clock signal DELAYED CLK at 606 and the low logic level in strobe signal DQS at 602 to provide a rising edge at 642 in phase detector output signal B at 610. OR gate 514 receives the rising edge at 642 in phase detector output signal B at 610 and continues to provide a high logic level in select input signal C at 612. Multiplexer 516 receives the high logic level in select input signal C at 612 and continues selecting clock signal CLK at 600. The low logic level in clock signal CLK at 600 is provided as a low logic level in updating strobe signal UDQS at 604.

Clock phase detector 510 receives a rising edge at 644 in strobe signal DQS at 602 and performs an EXCLUSIVE NOR function on the subsequent high logic level in strobe signal DQS at 602 and the low logic level in clock signal CLK at 600 to provide a falling edge at 646 in phase detector output signal A at 608. Also, delayed clock phase detector 512 receives the rising edge at 644 in strobe signal DQS at 602 and performs an EXCLUSIVE NOR function on the subsequent high logic level in strobe signal DQS at 602 and the low logic level in delayed clock signal DELAYED CLK at 606 to provide a falling edge at 648 in phase detector output signal B at 610. OR gate 514 receives the falling edge at 646 in phase detector output signal A at 608 and the falling edge at 648 in phase detector output signal B at 610 and provides a falling edge at 650 in select input signal C at 612. Multiplexer 516 receives the low logic level in select input signal C at 612 and selects strobe signal DQS at 602. The high logic level in strobe signal DQS at 602 is provided as a rising edge at 652 and a high logic level in updating strobe signal UDQS at 604.

In this example, following the rising edge at 614 in clock signal CLK at 600, the falling edge at 624 in strobe signal DQS at 602 occurs after the rising edge at 620 in delayed clock signal DELAYED CLK at 606. Clock phase detector 510 provides the falling edge at 626 in phase detector output signal A at 608 and delayed clock phase detector 512 provides the falling edge at 628 in phase detector output signal B at 610 in response to the falling edge at 624 in strobe signal DQS at 602. Also, OR gate 514 provides the falling edge at 630 in select input signal C at 612 and multiplexer 516 provides the falling edge at 632 in updating strobe signal UDQS at 604 in response to the falling edge at 624 in strobe signal DQS at 602.

Figure 9:
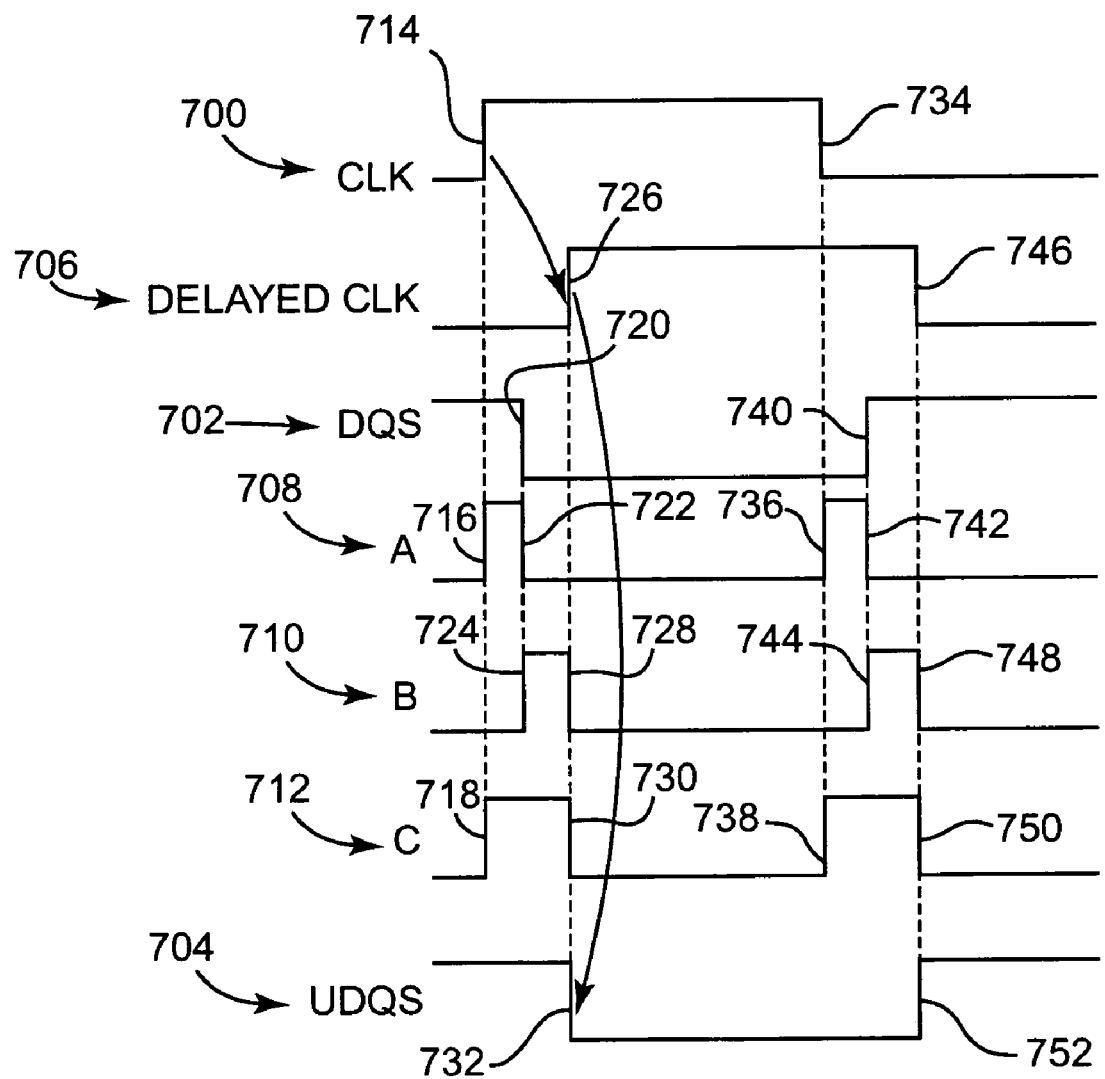
FIG. 9 is a timing diagram illustrating another example operation of the updating strobe circuit of FIG. 7.

FIG. 9 is a timing diagram illustrating another example operation of updating strobe circuit 500 of FIG. 7. Updating strobe circuit 500 receives clock signal CLK at 700 and strobe signal DQS at 702 and provides updating strobe signal UDQS at 704. Delay circuit 508 delays clock signal CLK at 700 to provide delayed clock signal DELAYED CLK at 706. Clock phase detector 510 receives clock signal CLK at 700 and strobe signal DQS at 702 and provides phase detector output signal A at 708. Delayed clock phase detector 512 receives strobe signal DQS at 702 and delayed clock signal DELAYED CLK at 706 and provides phase detector output signal B at 710. OR gate 514 receives phase detector output signal A at 708 and phase detector output signal B at 710 and performs an OR function on the inputs to provide select input signal C at 712 to the select input of multiplexer 516. Multiplexer 516 selects between clock signal CLK at 700 and strobe signal DQS at 702 based on select input signal C at 712 to provide updating strobe signal UDQS at 704.

To begin, clock phase detector 510 performs an EXCLUSIVE NOR function on a low logic level in clock signal CLK at 700 and a high logic level in strobe signal DQS at 702 and provides a low logic level in phase detector output signal A at 708. Delayed clock phase detector 512 performs an EXCLUSIVE NOR function on a low logic level in delayed clock signal DELAYED CLK at 706 and a high logic level in strobe signal DQS at 702 and provides a low logic level in phase detector output signal B at 710. OR gate 514 receives the low logic level in phase detector output signal A at 708 and the low logic level in phase detector output signal B at 710 and provides a low logic level in select input signal C at 712. Multiplexer 516 receives the low logic level in select input signal C at 712 and selects strobe signal DQS at 702. The high logic level in strobe signal DQS at 702 is provided as a high logic level in updating strobe signal UDQS at 704.

Clock phase detector 510 receives a rising edge at 714 in clock signal CLK at 700 and performs an EXCLUSIVE NOR function on the subsequent high logic level in clock signal CLK at 700 and the high logic level in strobe signal DQS at 702 to provide a rising edge at 716 in phase detector output signal A at 708. OR gate 514 receives the rising edge at 716 in phase detector output signal A at 708 and provides a rising edge at 718 in select input signal C at 712. Multiplexer 516 receives the high logic level in select input signal C at 712 and selects clock signal CLK at 700. The high logic level in clock signal CLK at 700 is provided as a high logic level in updating strobe signal UDQS at 704.

Clock phase detector 510 receives a falling edge at 720 in strobe signal DQS at 702 and performs an EXCLUSIVE NOR function on the subsequent low logic level in strobe signal DQS at 702 and the high logic level in clock signal CLK at 700 to provide a falling edge at 722 in phase detector output signal A at 708. Also, delayed clock phase detector 512 receives the falling edge at 720 in strobe signal DQS at 702 and performs an EXCLUSIVE NOR function on the subsequent low logic level in strobe signal DQS at 702 and the low logic level in delayed clock signal DELAYED CLK at 706 to provide a rising edge at 724 in phase detector output signal B at 710. OR gate 514 receives the falling edge at 722 in phase detector output signal A at 708 and the rising edge at 724 in phase detector output signal B at 710 and continues to provide a high logic level in select input signal C at 712. Multiplexer 516 receives the high logic level in select input signal C at 712 and selects clock signal CLK at 700. The high logic level in clock signal CLK at 700 is provided as a high logic level in updating strobe signal UDQS at 704.

Delayed clock phase detector 512 receives a rising edge at 726 in delayed clock signal DELAYED CLK at 706 and performs an EXCLUSIVE NOR function on the subsequent high logic level in delayed clock signal DELAYED CLK at 706 and the low logic level in strobe signal DQS at 702 to provide a falling edge at 728 in phase detector output signal B at 710. OR gate 514 receives the falling edge at 728 in phase detector output signal B at 710 and provides a falling edge at 730 in select input signal C at 712. Multiplexer 516 receives the low logic level in select input signal C at 612 and selects strobe signal DQS at 702. The low logic level in strobe signal DQS at 702 provides a falling edge at 732 in updating strobe signal UDQS at 704.

Next, clock phase detector 510 receives a falling edge at 734 in clock signal CLK at 700 and performs an EXCLUSIVE NOR function on the subsequent low logic level in clock signal CLK at 700 and the low logic level in strobe signal DQS at 702 to provide a rising edge at 736 in phase detector output signal A at 708. OR gate 514 receives the rising edge at 736 in phase detector output signal A at 708 and provides a rising edge at 738 in select input signal C at 712. Multiplexer 516 receives the high logic level in select input signal C at 712 and selects clock signal CLK at 700. The low logic level in clock signal CLK at 700 is provided as a low logic level in updating strobe signal UDQS at 704.

Clock phase detector 510 receives a rising edge at 740 in strobe signal DQS at 702 and performs an EXCLUSIVE NOR function on the subsequent high logic level in strobe signal DQS at 702 and the low logic level in clock signal CLK at 700 to provide a falling edge at 742 in phase detector output signal A at 708. Also, delayed clock phase detector 512 receives the rising edge at 740 in strobe signal DQS at 702 and performs an EXCLUSIVE NOR function on the subsequent high logic level in strobe signal DQS at 702 and the high logic level in delayed clock signal DELAYED CLK at 706 to provide a rising edge at 744 in phase detector output signal B at 710. OR gate 514 receives the falling edge at 742 in phase detector output signal A at 708 and the rising edge at 744 in phase detector output signal B at 710 and continues to provide a high logic level in select input signal C at 712. Multiplexer 516 receives the high logic level in select input signal C at 712 and selects clock signal CLK at 700. The low logic level in clock signal CLK at 700 is provided as a low logic level in updating strobe signal UDQS at 704.

Delayed clock phase detector 512 receives a falling edge at 746 in delayed clock signal DELAYED CLK at 706 and performs an EXCLUSIVE NOR function on the subsequent low logic level in delayed clock signal DELAYED CLK at 706 and the high logic level in strobe signal DQS at 702 to provide a falling edge at 748 in phase detector output signal B at 710. OR gate 514 receives the falling edge at 748 in phase detector output signal B at 710 and provides a falling edge at 750 in select input signal C at 712. Multiplexer 516 receives the low logic level in select input signal C at 612 and selects strobe signal DQS at 702. The high logic level in strobe signal DQS at 702 provides a rising edge at 752 in updating strobe signal UDQS at 704.

In this example, following the rising edge at 714 in clock signal CLK at 700, the falling edge at 720 in strobe signal DQS at 702 occurs before the rising edge at 726 in delayed clock signal DELAYED CLK at 706. Delayed clock phase detector 512 provides the falling edge at 728 in phase detector output signal B at 710 in response to the rising edge at 726 in delayed clock signal DELAYED CLK at 706. Also, OR gate 514 provides the falling edge at 730 in select input signal C at 712 and multiplexer 516 provides the falling edge at 732 in updating strobe signal UDQS at 704 in response to the rising edge at 726 in delayed clock signal DELAYED CLK at 706, which follows the rising edge at 714 in clock signal CLK at 700.

Updating strobe circuit 500 (shown in FIG. 7) is similar to updating strobe circuit 130 (shown in FIG. 4). Updating strobe circuit 500 receives a strobe signal DQS and a clock signal CLK and provides an updating strobe signal UDQS. The falling edge of updating strobe signal UDQS can be used to update output signals that are clocked into an integrated circuit chip. In one embodiment, the output signals are clocked into flip-flops, such as flip-flops 134 and 136 (shown in FIG. 4), via a delayed clock signal, such as delayed clock signal DCLK at 144, to provide a rising edge data signal, such as rising edge data signal RDATA at 108, and a falling edge data signal, such as falling edge data signal FDATA at 110.

Updating strobe circuit 500 synchronizes the falling edge of updating strobe signal UDQS to strobe signal DQS and clock signal CLK. Also, the falling edge of updating strobe signal UDQS can be synchronized to clocking the updated output signals into the integrated circuit chip. The falling edge of updating strobe signal UDQS occurs in response to either the falling edge of strobe signal DQS or a rising edge in delayed clock signal DELAYED CLK, whichever occurs later after a rising edge of clock signal CLK. In one embodiment, the falling edge of updating strobe signal UDQS occurs in response to either the falling edge of strobe signal DQS or a rising edge in delayed clock signal DELAYED CLK, whichever occurs later after a rising edge of clock signal CLK, and the rising edge of delayed clock signal DELAYED CLK occurs after clocking the updated output signals into the integrated circuit chip during the clock cycle beginning with the rising edge of clock signal CLK.

Updating the output signals is synchronized to strobe signal DQS and clock signal CLK to ensure that the skew of strobe signal DQS and of sampled data bits does not affect clocking the sampled data bits into the integrated circuit chip via the clock signal CLK. Reliable communications can be maintained with an increased number of data signals sampled in parallel via one strobe signal, and with an increase in the input data bit and strobe signal speeds.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An input circuit, comprising:
   a first circuit configured to receive a first signal and a second signal and to sample the first signal via the second signal and provide signal samples of the first signal;
   a second circuit configured to receive a third signal and the signal samples and to update a second circuit output signal via the third signal and provide the updated second circuit output signal; and
   a third circuit configured to receive a clock signal and the second signal and to provide the third signal, wherein the third circuit is configured to synchronize edges in the third signal to edges in the second signal and edges in the clock signal.

2. The input circuit of claim 1, comprising:
   a fourth circuit configured to receive the updated second circuit output signal and to clock the updated second circuit output signal into the fourth circuit via the clock signal.

3. The input circuit of claim 1, wherein the third circuit is configured to delay the clock signal and synchronize edges of the third signal to edges of the delayed clock signal.

4. The input circuit of claim 1, wherein the third circuit comprises:
   a first phase detector configured to receive the second signal and the clock signal and provide a first output that indicates the phase difference between the second signal and the clock signal;
   a second phase detector configured to receive the second signal and a delayed clock signal and provide a second output that indicates the phase difference between the second signal and the delayed clock signal; and
   a fourth circuit configured to provide the third signal based on the first output and the second output.

5. The input circuit of claim 4, wherein the fourth circuit comprises:
   a multiplexer configured to select between the second signal and the clock signal based on the first output and the second output to provide the third signal.

6. A random access memory, comprising:
   a first circuit configured to receive a first data signal and an updating strobe signal and to update a first circuit output signal to the first data signal via updating edges of the updating strobe signal;
   a second circuit configured to receive a clock signal and the updated first circuit output signal and clock the updated first circuit output signal into the second circuit via clocking edges of the clock signal; and
   a third circuit configured to receive the clock signal and provide the updating strobe signal, wherein updating edges of the updating strobe signal are synchronized to clocking edges of the clock signal.

7. The random access memory of claim 6, comprising:
   a fourth circuit configured to receive a second data signal and a strobe signal and sample the second data signal via sampling edges of the strobe signal to provide the first data signal.

8. The random access memory of claim 7, wherein the third circuit is configured to synchronize updating edges of the updating strobe signal to clocking edges of the clock signal and sampling edges of the strobe signal.

9. The random access memory of claim 7, wherein the third circuit is configured to provide updating edges of the updating strobe signal based on the latter of sampling edges of the strobe signal and delayed clocking edges of the clock signal.

10. The random access memory of claim 6, wherein the first circuit comprises:
    a first latch configured to update a rising edge data signal via updating edges of the updating strobe signal; and
    a second latch configured to update a falling edge data signal via updating edges of the updating strobe signal.

11. The random access memory of claim 10, wherein the second circuit comprises:
    a first clocked circuit configured to clock the updated rising edge data signal into the first clocked circuit via clocking edges of the clock signal; and
    a second clocked circuit configured to clock the updated falling edge data signal into the second clocked circuit via clocking edges of the clock signal.

12. A random access memory, comprising:
    a first circuit configured to receive a data signal and a strobe signal and to sample the data signal via sampling edges of the strobe signal to provide rising edge data bits and falling edge data bits;
    a second circuit configured to receive the rising edge data bits and the falling edge data bits and to pass the rising edge data bits and the falling edge data bits through the second circuit via updating edges of an updating strobe signal to provide updated rising edge data bits and updated falling edge data bits;
    a third circuit configured to receive the updated rising edge data bits and the updated falling edge data bits and to clock the updated rising edge data bits and the updated falling edge data bits into the third circuit via clocking edges of a clock signal; and
    a fourth circuit configured to receive the strobe signal and the clock signal and provide the updating strobe signal, wherein updating edges of the updating strobe signal are synchronized to clocking edges of the clock signal and sampling edges of the strobe signal.

13. The random access memory of claim 12, wherein the fourth circuit is configured to delay the clock signal and base the updating edges of the updating strobe signal on the latter of clocking edges of the delayed clock signal and sampling edges of the strobe signal.

14. The random access memory of claim 12, wherein the fourth circuit comprises:
    a first phase detector configured to receive the strobe signal and the clock signal and provide a first output that indicates the phase difference between the strobe signal and the clock signal;
    a second phase detector configured to receive the strobe signal and a delayed clock signal and provide a second output that indicates the phase difference between the strobe signal and the delayed clock signal; and
    a fifth circuit configured to provide the updating strobe signal based on the first output and the second output.

15. The random access memory of claim 14, wherein the fifth circuit comprises:
    a multiplexer configured to select between the strobe signal and the clock signal based on the first output and the second output to provide the updating strobe signal.

16. A computer system, comprising:
    means for receiving a first signal and a second signal;

means for sampling the first signal via the second signal to provide signal samples;

means for updating an output signal to the signal samples via a third signal to provide an updated output signal; and means for providing edges in the third signal synchronized to edges in the second signal and edges in a clock signal.

17. The computer system of claim 16, comprising:

means for clocking the updated output signal into a second circuit via the clock signal.

18. The computer system of claim 16, wherein the means for providing edges in the third signal comprises:

means for delaying the clock signal; and means for synchronizing edges of the third signal to edges of the delayed clock signal.

19. The computer system of claim 18, wherein the means for providing edges in the third signal comprises:

means for detecting the phase difference between the second signal and the clock signal to provide a first output;

means for detecting the phase difference between the second signal and the delayed clock signal to provide a second output; and means for selecting between the second signal and the clock signal based on the first output and the second output to provide the third signal.

20. A method for inputting signals into a memory device, comprising:

receiving a first signal and a second signal;

sampling the first signal via the second signal to provide signal samples;

synchronizing edges in a third signal to edges in the second signal and edges in a clock signal; and updating an output signal to the signal samples via the third signal to provide an updated output signal.

21. The method of claim 20, comprising:

clocking the updated output signal into a second circuit via the clock signal.

22. The method of claim 20, wherein synchronizing edges in a third signal comprises:

delaying the clock signal; and synchronizing edges in the third signal to edges in the delayed clock signal.

23. The method of claim 22, wherein synchronizing edges in a third signal comprises:

detecting the phase difference between the second signal and the clock signal to provide a first output;

detecting the phase difference between the second signal and the delayed clock signal to provide a second output; and selecting between the second signal and the clock signal based on the first output and the second output.

24. A method for inputting signals into a random access memory, comprising:

synchronizing updating edges of an updating strobe signal to clocking edges of a clock signal;

updating an output signal of a first circuit to a first data signal via updating edges of the updating strobe signal to provide an updated output signal; and clocking the updated output signal into a second circuit via clocking edges of the clock signal.

25. The method of claim 24, comprising:

receiving a second data signal and a strobe signal; and sampling the second data signal via sampling edges of the strobe signal to provide the first data signal.

26. The method of claim 25, comprising:

synchronizing updating edges of the updating strobe signal to sampling edges of the strobe signal.

27. The method of claim 25, comprising:

synchronizing updating edges in the updating strobe signal to clocking edges of the clock signal and sampling edges of the strobe signal based on the latter of the sampling edges of the strobe signal and delayed clocking edges of the clock signal.

28. A method for inputting signals into a random access memory, comprising:

receiving a data signal and a strobe signal;

sampling the data signal via sampling edges of the strobe signal to provide rising edge data bits and falling edge data bits;

synchronizing updating edges of an updating strobe signal to clocking edges of a clock signal and sampling edges of the strobe signal;

passing the rising edge data bits and the falling edge data bits into a first circuit via updating edges of the updating strobe signal to provide updated rising edge data bits and updated falling edge data bits; and clocking the updated rising edge data bits and the updated falling edge data bits into a second circuit via clocking edges of the clock signal.

29. The method of claim 28, wherein synchronizing updating edges of an updating strobe signal comprises:

delaying the clock signal; and basing updating edges of the updating strobe signal on the latter of sampling edges of the strobe signal and delayed clocking edges of the delayed clock signal.

30. The method of claim 29, wherein synchronizing updating edges of an updating strobe signal comprises:

detecting the phase difference between the strobe signal and the clock signal to provide a first output;

detecting the phase difference between the strobe signal and the delayed clock signal to provide a second output; and providing the updating strobe signal based on the first output and the second output.

31. The method of claim 30, wherein providing the updating strobe signal comprises:

selecting between the strobe signal and the clock signal based on the first output and the second output.

* * * * *